(12) United States Patent
Kao

(10) Patent No.: US 7,573,316 B2
(45) Date of Patent: Aug. 11, 2009

(54) CONTROL APPARATUS

(75) Inventor: Peng-Feng Kao, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 30 days.

(21) Appl. No.: 11/889,406

(22) Filed: Aug. 13, 2007

(65) Prior Publication Data

US 2008/0265979 A1 Oct. 30, 2008

(30) Foreign Application Priority Data

Apr. 25, 2007 (TW) .............................. 96114581 A

(51) Int. Cl.
*H03K 17/687* (2006.01)

(52) U.S. Cl. .................... 327/427; 327/108; 327/434; 326/83

(58) Field of Classification Search ......... 327/108–112, 327/427, 434–437; 326/82–88
See application file for complete search history.

(56) References Cited

U.S. PATENT DOCUMENTS

| | | | | |
|---|---|---|---|---|
| 5,317,206 A | * | 5/1994 | Hanibuchi et al. ............ 326/21 |
| 5,386,157 A | * | 1/1995 | Murphy et al. ................ 326/33 |
| 5,455,527 A | * | 10/1995 | Murphy et al. ................ 326/83 |
| 6,384,643 B1 | * | 5/2002 | Grose et al. .................. 327/112 |
| 6,567,441 B2 | * | 5/2003 | Furudate et al. .......... 372/38.02 |
| 7,038,504 B2 | * | 5/2006 | Sakamoto et al. ............ 327/112 |
| 7,245,155 B2 | * | 7/2007 | Watarai ....................... 326/83 |

* cited by examiner

*Primary Examiner*—Lincoln Donovan
*Assistant Examiner*—Patrick O'Neill
(74) *Attorney, Agent, or Firm*—Muncy, Geissler, Olds & Lowe, PLLC

(57) ABSTRACT

A control apparatus comprises a voltage source, a controlling unit and an enabling unit. The controlling unit receives an input signal and generates an output signal. The enabling unit controls whether the controlling unit generates the output signal or not according to an enabling signal. The enabling unit comprises a first switch, a second resistor, a third resistor and a third transistor. The first switch selectively turns on or off according to the enabling signal. A first terminal of the second resistor is coupled to the first switch. A first terminal of the third resistor is coupled to a second terminal of the second resistor and a second terminal of the third resistor is coupled to the ground terminal. A source of the third transistor is coupled to the ground terminal and a gate of the third transistor is coupled between the second and the third resistor.

10 Claims, 1 Drawing Sheet

CONTROL APPARATUS

BACKGROUND OF THE INVENTION

1. Field of the Invention

The invention relates to a control apparatus, and in particular a control apparatus for preventing an electronic device from activating during electric power leakage.

2. Description of the Related Art

Along with technological improvement and business growth, various electronic devices have been developed to improve the lifestyle of human beings. Accordingly, electronic devices all require some sort of electronic power. As such, one might say, electronic power plays an important role in modern-day life of human beings.

Although an electronic device may be powered off, the electronic elements in the electronic device, for example internal power supply terminals, may still receive partial power from the power supply terminal leading to unnecessary power lost. Moreover, under certain conditions, if enough power is leaked from the power supply terminal, back-end electronic elements may be turned on. For example, for a motor control device, although a user may not have turned on the motor, the motor control device in the motor system may receive power from a power supply terminal due to internal electric power leakage. If the power received by the motor control device passes a sufficient threshold, the motor will be activated. In the example, not only does unnecessary power lost occur, significant trouble for the user may also occur.

Therefore, decreasing electric power leakage when electronic devices are turned off and preventing electronic devices from turning on due to low voltage leakage are currently major issues of concern.

BRIEF SUMMARY OF INVENTION

A detailed description is given in the following embodiments with reference to the accompanying drawings.

An embodiment of the invention provides a control apparatus comprising a voltage source, a controlling unit and an enabling unit. The controlling unit is coupled to the voltage source for receiving an input signal and generating an output signal. The enabling unit, coupled to the voltage source, the controlling unit and a ground terminal control, based upon the enabling signal, whether or not the controlling unit generates the output signal. The enabling unit comprises a first switch, a second resistor, a third resistor and a third transistor. The first switch is used for selectively turning on or off according to the enabling signal. A first terminal of the second resistor is coupled to the first switch. A first terminal of the third resistor is coupled to a second terminal of the second resistor and a second terminal of the third resistor is coupled to the ground terminal. A source of the third transistor is coupled to the ground terminal and a gate of the third transistor is coupled between the second and the third resistor.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
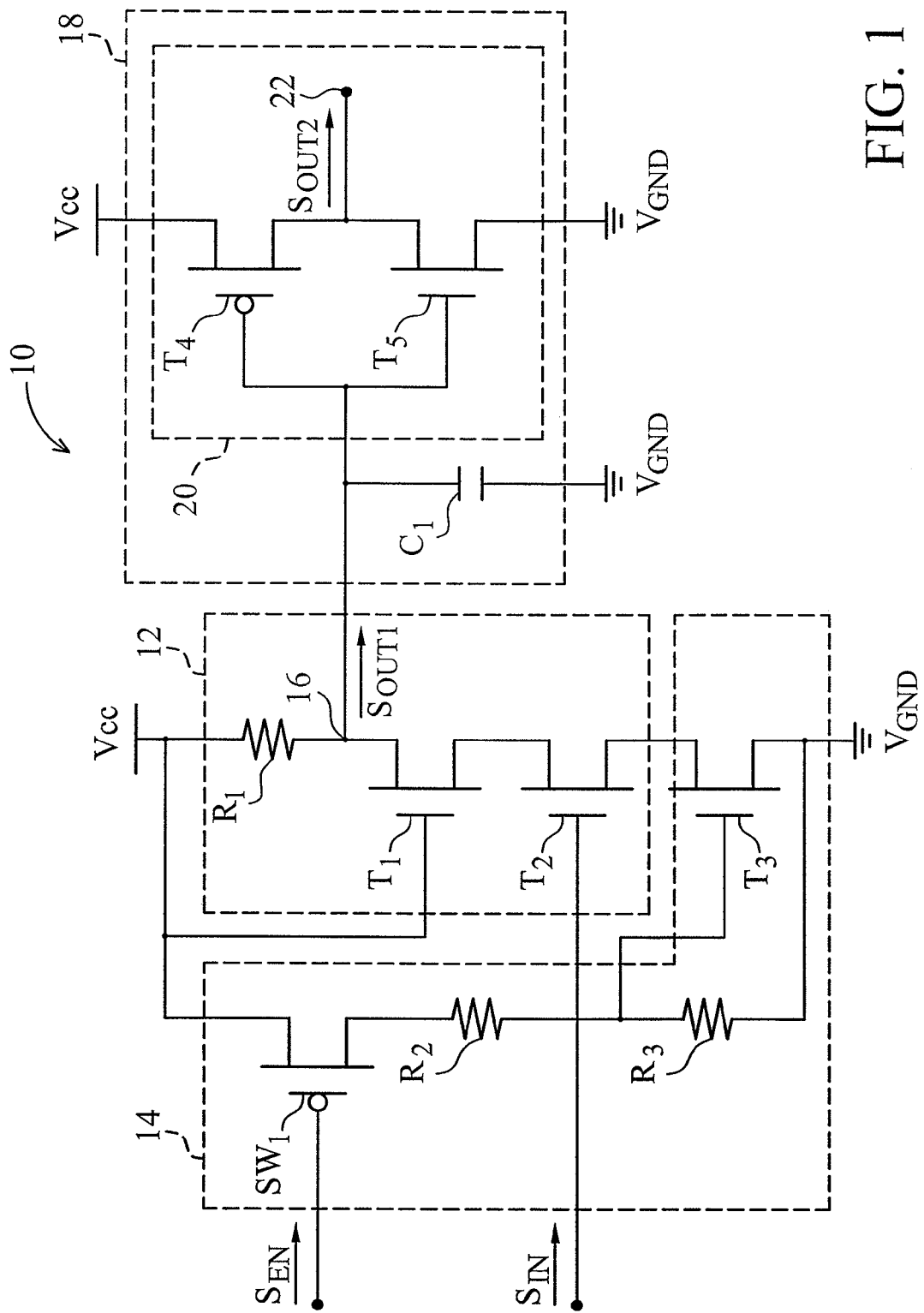
FIG. 1 is an exemplary diagram of a control apparatus according to an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

Referring to FIG. 1, FIG. 1 is an exemplary diagram of a control apparatus according to an embodiment of the invention. As illustrated in FIG. 1, the control apparatus 10 comprises a voltage source Vcc, a controlling unit 12 and an enabling unit 14. The controlling unit 12 is coupled to the voltage source for receiving an input signal $S_{IN}$ and generating an output signal $S_{OUT1}$. The enabling unit 14 is coupled to the voltage source Vcc, the controlling unit 12 and a ground terminal $V_{GND}$ for controlling whether or not the controlling unit 12 generates the output signal $S_{OUT1}$ according to an enabling signal $S_{EN}$.

Wherein the controlling unit 12 comprises a first resistor R1, a first transistor T1, a second transistor T2 and a first output terminal 16. The first terminal of the first resistor R1 is coupled to the voltage source Vcc. The drain of the first transistor T1 is coupled to the second terminal of the first resistor R1 and the gate of the first transistor T1 is coupled to the voltage source Vcc. The drain of the second transistor T2 is coupled to the source of the first transistor T1 and the gate of the second transistor is used for receiving the input signal $S_{IN}$. The first output terminal is coupled between the first resistor R1 and the drain of the first transistor T1 for generating and outputting the output signal $S_{OUT1}$.

Wherein the enabling unit 14 comprises a first switch SW1, a second resistor R2, a third resistor R3 and a third transistor T3. The first terminal of the first switch SW1 is coupled to the voltage source Vcc and selectively turns on or off according to the enabling signal $S_{EN}$. The first terminal of the second resistor R2 is coupled to the second terminal of the first switch SW1. The first terminal of the third resistor R3 is coupled to the second terminal of the second resistor R2 and a second terminal of the third resistor R3 is coupled to the ground terminal $V_{GND}$. The drain of the third transistor T3 is coupled to the source of the second transistor T2, the source of the third transistor T3 is coupled to the ground terminal $V_{GND}$ and the gate of the third transistor T3 is coupled between the second resistor R2 and the third resistor R3.

When the first switch SW1 is turned on by the enabling signal $S_{EN}$, the enabling unit 14 enables the control unit 12 to generate the output signal $S_{OUT1}$. When the first switch SW1 is turned off by the enabling signal $S_{EN}$, the enabling unit 14 enables the controlling unit 12 to stop generating the output signal $S_{OUT1}$. Thus, when the users is turning off electronic devices, the users is turning off the first switch SW1 by the enabling signal $S_{EN}$ to ensure that the control unit 12 will not generate the output signal $S_{OUT1}$. Therefore, back-end electronic devices will not be turned on.

In the embodiment, the first transistor T1, the second transistor T2 and the third transistor T3 are NMOS transistors. The first switch SW1 is a PMOS transistor. The source of the PMOS transistor is coupled to the voltage source Vcc. The drain of the PMOS transistor is coupled to the second transistor R2. The first switch SW1 selectively turns on or off according to the enabling signal $S_{EN}$ received by the gate of the PMOS transistor.

In addition, the control apparatus 10 further comprises an adjusting unit 18 coupled to the controlling unit 12 for adjusting the output signal $S_{OUT1}$. The adjusting unit 18 comprises a capacitor C1 and an inverter 20. The capacitor C1 is coupled between the first output terminal 16 of the controlling unit 12 and the ground terminal $V_{GND}$ for eliminating noise of the output signal $S_{OUT1}$ outputted by the first terminal 16. The inverter 20 is coupled between the voltage source Vcc, the first terminal 16 of the controlling unit 12 and the ground terminal $V_{GND}$ for adjusting the output signal $S_{OUT1}$ and outputting the adjusted output signal $S_{OUT2}$.

In the embodiment, the inverter 20 comprises a fourth transistor T4, a fifth transistor T5 and a second output terminal 22. The source of the fourth transistor T4 is coupled to the voltage source Vcc. The gate of the fourth transistor T4 is coupled to the first output terminal 16 of the controlling unit 12 for receiving the output signal $S_{OUT1}$. The drain of the fifth transistor T5 is coupled to the drain of the fourth transistor T4. The gate of the fifth transistor T5 is coupled to the first output terminal 16 of the controlling unit 12. The source of the fifth transistor T5 is coupled to the ground terminal $V_{GND}$. The second output terminal 22 is coupled between the drain of the fourth transistor T4 and the drain of the fifth transistor T5 for outputting the adjusted output signal $S_{OUT2}$. Wherein the fourth transistor T4 and fifth transistor T5 each performs waveform adjustments to the output signal $S_{OUT1}$ separately and the adjusted output signal $S_{OUT2}$ is outputted from the second terminal 22.

In the embodiment, the fourth transistor T4 is a PMOS transistor. The fifth transistor T5 is a NMOS transistor.

The control apparatus according to the embodiment of the invention can be applied to the back-end amplifying circuit of the driving circuit of motor systems by adding the enabling unit into the driving apparatus and turning on and off the PMOS switch by employing the control signal. Thus, when the motors are not required to be operational, the PMOS switch can be turned off by the control signal to ensure that the driving circuit will not be activated due to electric power leakage. Namely, the motors are not powered up and the motor system is not triggered by error. As such, according to the embodiment of the invention, should electric power leakage occur in electronic devices, the problem of triggering by error will be avoided by the control apparatus.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the Art). Therefore, the scope of the appended claims should be accorded the broadest interpretation so as to encompass all such modifications and similar arrangements.

What is claimed is:

1. A control apparatus, comprising:
   a voltage source;
   a controlling unit, coupled to the voltage source for receiving an input signal and generating an output signal wherein the controlling unit comprises:
   a first resistor, a first terminal of the first resistor coupled to the voltage source;
   a first transistor, a drain of the first transistor coupled to a second terminal of the first resistor and a gate of the first transistor coupled to the voltage source;
   a second transistor, a drain of the second transistor coupled to a source of the first transistor, a source of the second transistor coupled to a drain of a third transistor and a gate of the second transistor for receiving the input signal; and
   a first output terminal, coupled between the first resistor and the drain of the first transistor for generating the output signal; and
   an enabling unit, coupled to the voltage source, the controlling unit and a ground terminal for controlling whether or not the controlling unit generates the output signal according to an enabling signal, wherein the enabling unit comprises:
   a first switch, a first terminal of the first switch coupled to the voltage source for selectively turning on or turning off according to the enabling signal;
   a second resistor, a first terminal of the second resistor coupled to a second terminal of the first switch;
   a third resistor, a first terminal of the third resistor coupled to a second terminal of the second resistor and a second terminal of the third resistor coupled to the ground terminal; and
   the third transistor, a source of the third transistor coupled to the ground terminal and a gate of the third transistor coupled between the second and the third resistor.

2. The control apparatus as claimed in claim 1, wherein when the first switch is turned on by the enabling signal, the controlling unit generates the output signal.

3. The control apparatus as claimed in claim 2, wherein when the first switch is turned off by the enabling signal, the controlling unit stops generating the output signal.

4. The control apparatus as claimed in claim 1, wherein the first, the second and the third transistors are NMOS transistors.

5. The control apparatus as claimed in claim 1, wherein the first switch is a PMOS transistor, a source of the PMOS transistor is coupled to the voltage source, a drain of the PMOS transistor is coupled to the second resistor, the first switch selectively turning on or turning off according to the enabling signal received by the gate of the PMOS transistor.

6. The control apparatus as claimed in claim 1, wherein the control apparatus further comprises an adjusting unit, coupled to the controlling unit for adjusting the output signal and outputting an adjusted output signal.

7. The control apparatus as claimed in claim 6, wherein the adjusting unit comprises:
   a capacitor, coupled between the controlling unit and the ground terminal for eliminating noise of the output signal; and
   an inverter, coupled between the voltage source, the controlling unit and the ground terminal for adjusting the output signal and outputting the adjusted output signal.

8. The control apparatus as claimed in claim 7, wherein the inverter comprises:
   a fourth transistor, a source of the fourth transistor coupled to the voltage source, a gate of the fourth transistor coupled to the first output terminal of the controlling unit for receiving the output signal;
   a fifth transistor, a drain of the fifth transistor coupled to a drain of the fourth transistor, a gate of the fifth transistor coupled to the first output terminal of the controlling unit for receiving the output signal and a source of the fifth transistor coupled to the ground terminal; and
   a second output terminal, coupled between the drain of the fourth transistor and the drain of the fifth transistor for outputting the adjusted output signal;
   wherein the fourth and fifth transistors each perform waveform adjustment to the output signal separately and the adjusted output signal is outputted from the second terminal.

9. The control apparatus as claimed in claim 8, wherein the fourth transistor is a PMOS transistor.

10. The control apparatus as claimed in claim 8, wherein the fifth transistor is a NMOS transistor.

* * * * *